United States Patent
Pauchard et al.

(10) Patent No.: US 6,246,099 B1
(45) Date of Patent: Jun. 12, 2001

(54) PHOTOSENSITIVE SEMICONDUCTOR ELEMENT HAVING AN OUTER LAYER DIVIDED INTO MUTUALLY SPACED REGIONS

(75) Inventors: Alexandre Pauchard, Bulle; Radivoje Popovic, Sulpice; Robert Racz, Zug, all of (CH)

(73) Assignee: Electrowatt Technology Innovation AG, Zug (CH)

( * ) Notice: Subject to any disclaimer, the term of this patent is extended or adjusted under 35 U.S.C. 154(b) by 0 days.

(21) Appl. No.: 09/393,239

(22) Filed: Sep. 9, 1999

(30) Foreign Application Priority Data

Sep. 10, 1998 (EP) .................................. 98117134

(51) Int. Cl.$^7$ .............................. H01L 31/06; H01L 31/00
(52) U.S. Cl. ......................... 257/465; 257/448; 257/461
(58) Field of Search .................... 257/448, 443, 257/461, 465

(56) References Cited

U.S. PATENT DOCUMENTS

| | | |
|---|---|---|
| 4,160,985 | 7/1979 | Kamins et al. . |
| 4,626,884 * | 12/1986 | Shannon . |
| 4,835,525 | 5/1989 | Egi et al. . |
| 5,021,854 * | 6/1991 | Huth . |
| 5,339,070 | 8/1994 | Yalowitz et al. . |
| 5,942,788 * | 8/1999 | Takada et al. ....................... 257/438 |
| 6,087,703 * | 7/2000 | Ohta et al. .......................... 257/461 |
| 6,097,074 * | 8/2000 | Takakusa ............................ 257/440 |

FOREIGN PATENT DOCUMENTS

| | | |
|---|---|---|
| 0 296 371 A1 | 5/1988 | (EP) . |
| 2 107 050 | 4/1983 | (GB) . |
| 61-231776 | 10/1986 | (JP) . |
| 10-190039 | 7/1998 | (JP) . |

OTHER PUBLICATIONS

"A Silicon Ultraviolet Detector," R.S. Popović et al., *Sensors and Actuators*, No. 1/3, Mar., 1990, pp. 553–558.

"Photodiodes in Silicon with an Electrically–Programmable UV Response," R.F. Wolffenbuttel, *Sensors and Actuators*, No. 1/3, Mar., 1990, pp. 559–563.

"Flame Failure Detection and Modern Boilers," A R Jones, *Journal of Physics E/Scientific Instruments*, No. 10, Oct., 1998, pp. 921–928.

* cited by examiner

*Primary Examiner*—Ngân V. Ngô
(74) *Attorney, Agent, or Firm*—Proskauer Rose LLP

(57) ABSTRACT

The photosensitive semiconductor element according to the invention comprises a substrate 1, an intermediate layer 2 and an outer layer 5, wherein the intermediate layer 2 is at least partially embedded within the substrate 1 and the outer layer 5 is at least partially embedded within the intermediate layer 2 and the intermediate layer 2 and the outer layer 5 form a photosensitive region 22 for the generation of a light-dependent signal R such as for example a photocurrent. In this arrangement the outer layer 5 is divided into mutually spaced regions 11 which are separated by intermediate regions 13 of the intermediate layer 2. The spaced regions 11 of the outer layer then serve for example as the anode 30 of the photosensitive semiconductor element which can be connected to a suitable electronic evaluation arrangement. The spaced regions 11 prevent the formation of an inactive layer 12 which, by virtue of recombination phenomena in respect of charge carriers, results in a reduction in the photocurrent produced by the incident light.

13 Claims, 5 Drawing Sheets

PHOTOSENSITIVE SEMICONDUCTOR ELEMENT HAVING AN OUTER LAYER DIVIDED INTO MUTUALLY SPACED REGIONS

BACKGROUND OF THE INVENTION

1. Field of the Invention

The present invention concerns a photosensitive semiconductor element, a photosensitive semiconductor element arrangement, a photosensitive circuit and a method of regulating flames using the photosensitive semiconductor element or the photosensitive semiconductor element arrangement.

2. Description of the Prior Art

Photosensitive semiconductor elements, which are also known in the form of a photodiode or phototransistor, already exist as so-called pn-junctions of suitably doped semiconductor devices and are described for example in "Physics of Semiconductor Devices", 2nd edition, S. M. Sze, 1981, published by John Wiley & Sons, Inc., Part V, Chapter 13, "Photodetectors". Those photodetectors or photosensitive semiconductor elements serve for detecting light, that is to say visible or invisible light such as for example UV-light or IR-light. The three most important parameters for describing the quality of such photosensitive semiconductor elements are sensitivity, that is to say spectral sensitivity (sensitivity in relation to given wavelengths), response time, that is to say the time between incidence of the light and detection of a sensor signal, and finally quantum efficiency.

Photosensitive semiconductor elements of that kind are already known. For example A. R. Jones: "Flame failure detection and modern boilers", J. Phys. E.: Sci. Instrum. 21 (1988), 921–928, describes what are referred to as ultravioletsensitive gas discharge tubes which have a very high level of sensitivity and which are intrinsically selective. Nonetheless that type of photodetector is very expensive and fragile, it is of large size and it requires a very high level of power supply.

Furthermore conventional silicon photodiodes are known, which are provided with external or integrated filters in order thereby to acquire a certain degree of selectivity. Those photodiodes are very small and almost unbreakable. Interference filters can be used to achieve a high level of selectivity in the UV-range, that is to say in order to filter out visible light and IR-light adjoining the visible range. Nonetheless such UV-photodiodes are highly expensive as the interference filters push up the costs and as a result make the overall circuitry an unattractive proposition in terms of use in products involving large production numbers. On the other hand however there are also interference filters in a low price category, but they exhibit poorer filter properties for visible light and IR-light adjoining the visible range, so that in this case the level of selectivity is inadequate for most uses.

A commercially available UV-photodiode with a high level of selectivity is described for example in R. S. Popovic et al "A silicon ultraviolet detector", Sensors and Actuators, A 21–A 23, 1990, 553–558, and is known from EP 0 296 371, wherein those UV-photodiodes are subjected to a very expensive and tedious optimization procedure in regard to doping of the corresponding semiconductor layers in order to achieve that high level of selectivity. As a result those photodiodes are highly expensive and are scarcely suitable for use in products involving large numbers.

Those previously known semiconductor elements for detecting light, that is to say for example photodiodes, have a substrate of silicon, in which an intermediate layer and an outer layer are at least partially embedded. The intermediate layer and the outer layer are distinguished by a different form of doping. They are therefore for example p- or n-doped in order to produce the pn-junction required for the photocurrent. To generate a light-dependent signal, that is to say for example the photocurrent, the intermediate layer and the outer layer form a photosensitive region in which the incident photons cause the formation of charge carriers, that is to say electrons and holes, which are in the conduction band and the valence band respectively of the semiconductor. Transportation of those charge carriers and possibly further generation of charge carriers (avalanche effect) gives rise to a photocurrent which can be measured by suitable contacts at the surface of those layers. Depending on the respective structure and doping of the corresponding semiconductor layers, generation, transportation and speed of the charge carriers can be influenced. In most cases however the qualitative demands are in conflict with the structural options for the production of such components.

Accordingly the conventional photosensitive semiconductor elements either afford a high level of selectivity, but in that case are very large and very expensive, or they are small and cheap but involve a low level of selectivity or lack of effectiveness so that they cannot be reliably used for appropriately relevant electronic circuits. For example certain photosensitive semiconductor elements are provided for monitoring circuits which are intended to guarantee a fail-safe performance. Hitherto no usable configurations which are at the same time cheap and simple to produce have been available.

For example, conventional photosensitive semiconductor elements for use for monitoring flames in burners of heating installations for private houses or industrial buildings, for fire alarm systems or for building monitoring systems at reasonable item prices with a sufficiently high level of selectivity and adequate quantitative effectiveness are not available at the present time.

SUMMARY OF THE INVENTION

Therefore the object of the present invention is to provide a photosensitive semiconductor element or a photosensitive semiconductor element arrangement which avoids the disadvantages of the state of the art and is both small and also robust and which in addition exhibits a very high level of selectivity and effectiveness and a very high detection capability and which can be inexpensively produced by standard technologies or standard processes.

The photosensitive semiconductor element according to the invention comprises a substrate, an intermediate layer and an outer layer, wherein the intermediate layer is at least partially embedded within the substrate and the outer layer is at least partially embedded within the intermediate layer and the intermediate layer and the outer layer form a photosensitive region for the generation of a light-dependent signal such as for example a photocurrent. The outer layer which for example comprises P$^+$-doped silicon is divided into mutually spaced regions which are separated by intermediate regions of the intermediate layer. The intermediate layer then comprises for example N-doped silicon while the substrate comprises P-doped silicon and carries both the intermediate layer and also the outer layer at the surface of the photosensitive semiconductor element.

The spaced regions of the outer layer then serve for example as the anode of the photosensitive semiconductor element which serves as a photodiode and which can be connected to a suitable electronic evaluation arrangement. The intermediate layer additionally has an N⁺-doped region which then for example serves as the cathode of the photosensitive semiconductor element which is possibly short-circuited to a P⁺-doped region of the substrate.

The very high level of selectivity of the photosensitive semiconductor element according to the invention is achieved by separation of the outer layer into mutually spaced regions. In that case the outer layer is embedded in the intermediate layer ($N_{well}$), so that there is formed a potential barrier which delimits a photosensitive region as far as a given depth, as measured from the surface of the outer layer. In the case of the conventional semiconductor elements, the concentration of doping at the surface of the outer layer (for example P⁺-doping of boron) decreases by virtue of doping effects and the redistribution of doping atoms, although it is precisely here that a particularly high level of doping is wanted in order to achieve a high photocurrent. The mutually spaced regions prevent the formation of that "inactive" layer at the surface of the outer layer, which is formed when the outer layer is entirely embedded in the intermediate layer (see FIG. 3). That inactive region results from recombination of charge carriers produced by photons, that is to say electrons and holes, which can then no longer serve to produce the photocurrent and which thus result in an undesirable drop in the photocurrent produced.

In regard to such a photosensitive semiconductor element, it is particularly important that the electrons and holes do not recombine but flow separately to the respective anode or cathode, in order there to be suitably detected by an electronic evaluation arrangement. Recombination of the electrons and holes produced by the incident light at the outer surface of the outer layer at which the production of electrons and holes is at its greatest drastically reduces the photocurrent generated. As described above, that recombination effect occurs in particular due to the fact that the doped outer layer in the outer surface region, that is to say in the above-mentioned inactive zone, has a reduced concentration of doped boron atoms, which has various physical reasons therefor. For example, very strong doping effects and redistribution of boron atoms occur at the outer surface, so that here the concentration of doped boron atoms decreases although it is precisely at that location that a high level of boron concentration is required.

The provision of spaced regions of the outer layer substantially prevents the formation of the inactive layer. This gives a modified profile in respect of the energy band between the lower limit of the conduction band and the upper limit of the valence band of the correspondingly N-doped silicon atoms between the spaced regions of the outer layer (see FIG. 5) so that here—assisted by the potential produced thereby between the spaced regions—the minority carriers (holes) existing in that region are pushed downwardly and thus no or only a slight degree of recombination of electrons and holes can occur. That affords a high level of responsiveness in relation to incident light, which is something that is wanted at the surface of the outer layer, as the electrons and holes generated by the correspondingly incident photons almost completely flow away to the anode and the cathode respectively without already experiencing recombination beforehand. As a result the photocurrent is almost completely utilised for a given wavelength region for which the photodiode is designed.

This geometrical ploy not only achieves a very high level of selectivity in relation to incident light but it also provides for the implementation of a very inexpensive component which can be produced using standard technologies and which satisfies both the demands for a component which is produced in large numbers and also in terms of quality of the component.

In that respect all layers can be designed as standard as an integrated sensor and jointly diffused into one and the same substrate by means of the known CMOS technology. By virtue of the integrated structure of the entire photosensitive semiconductor element which is connected to an electronic evaluation arrangement which is advantageously also implemented on one and the same substrate by CMOS technology, it can be produced at very low prices. As a result, very inexpensive, small, robust, photosensitive semiconductors can be produced for the most widely varying uses, which can be constructed jointly in one process, possibly together with an electronic evaluation arrangement, on one and the same chip.

Depending on the respective doping used for the individual layers or depending on the respective thickness of the photosensitive region, it is possible to detect the most widely varying ranges of light, in which respect the desired selectivity is always achieved by the spacing of the corresponding regions at the surface of the photosensitive semiconductor element. The photosensitive region which includes the spaced regions, the intermediate regions and a part of the intermediate layer, for detection of given incident light wavelength ranges, is of a depth ($X_L$) of the order of magnitude of about one wavelength ($W_t$) of the incident light.

For example the photosensitive region for detection of ultraviolet light is of a depth of between about 0.01 and 0.8 μm, in particular between 0.1 and 0.4 μm and preferably 0.5 μm. In that respect the intermediate regions are advantageously of a width which is approximately twice as great as the depth of the photosensitive region as on the one hand that means that the mutually spaced regions become as small as possible, but in addition the intermediate regions do not become too large in order thereby to prevent a leakage current, that is to say the diffusion of holes into the subjacent substrate.

The invention also discloses a photosensitive semiconductor element arrangement which comprises one or more substrates, at least two intermediate layers and at least first and second outer layers, wherein the intermediate layers are at least partially embedded within the substrate, and the outer layers are at least partially embedded within the corresponding intermediate layers. The substrate, the intermediate layers and the outer layers form at least first and second photosensitive regions for the generation of light-dependent signals. The first outer layer comprises mutually spaced regions which are separated by intermediate regions of the corresponding intermediate layer. The function of those regions is identical to the above-described function, that is to say avoidance of the inactive layer at the surface of the first outer layer. The first outer layer forms with the corresponding intermediate layer the first photosensitive region of a given depth which, similarly to the above-described situation, is delimited by the potential barrier of the pn-junction. The second outer layer is short-circuited to the corresponding intermediate layer so that the second photosensitive region is formed beneath a depth of those second layers, which approximately corresponds to the magnitude of the first given depth and which comprises portions of the second intermediate layer and the substrate.

The first photosensitive region serves for the detection of a predetermined wavelength range (frequency range) of the incident light while the second photosensitive region serves for the detection of another wavelength range of the incident light, advantageously for detection of an incident light wavelength range which is adjacent to the predetermined wavelength range. In that case the corresponding layers of the semiconductor element are connected to an electronic evaluation arrangement in such a way that the adjacent wavelength range component detected by the first photosensitive region can be substantially suppressed. That can be achieved if the magnitude of the signal detected by the second photosensitive region, due to the incident light, approximately corresponds to the signal generated by the first photosensitive region, in the region in which the two overlap. The second photosensitive region is of such a size that the second signal which is produced by that region in relation to incident light from a predetermined wavelength ($W_{IR}$) is approximately equal to the first signal which is produced by the first region.

The first photosensitive region is for example designed primarily for the detection of UV-light and the second photosensitive region is designed primarily for the detection of IR-light. The first photosensitive region produces a first photocurrent and the second photosensitive region produces a second photocurrent, wherein the second photosensitive region is of such a size that, with an incident light from a wavelength of about 400–500 nm, the second photocurrent is approximately the same as the first photocurrent.

This "second" photosensitive semiconductor element which is arranged beside the "first" photosensitive semiconductor element then serves for example for the detection of IR-light, in which case both semiconductor elements can be connected together in such a way that the photocurrent of the IR-sensor is subtracted from the photocurrent of the UV-sensor so that an enhanced level of UV-selectivity is achieved. Depending on the respective layer thickness of the corresponding photosensitive regions, the correspondingly produced photocurrents can in that case be adjusted in such a way that both the UV-photocurrent and also the IR-photocurrent correspond in the mutually overlapping ranges so that, upon subtraction of the two currents, the result is an output signal which is almost zero outside the UV-range.

The two photosensitive semiconductor elements, that is to say the corresponding layers, can again be implemented on one and the same substrate, in which respect in this case also use can be made of CMOS technology. The combination of a UV-photodiode with the corresponding IR-photodiode makes it unnecessary to use expensive interference or color filters. Overall that affords a highly inexpensive but highly selective photodiode or photosensitive semiconductor element for the detection of different spectral ranges of the incident light.

These photosensitive semiconductor elements make it possible to afford photosensitive circuits which are small, inexpensive, frequency- and wavelength-selective, fast, robust, reliable and effective, wherein all layers of the semiconductor component or the photosensitive semiconductor element arrangement and/or the electronic evaluation arrangement can be jointly produced on one substrate using CMOS technology. That makes it unnecessary to provide expensive filters, connecting devices and the like.

The semiconductor elements according to the invention can be used for methods for regulating flames, in particular in burners of heating installations which burn by means of a mixture of air and fuel. Depending on the respectively set air-fuel mixture, those flames burn with varying levels of intensity and with varying combustion values, with light being respectively emitted in different spectral ranges. The highly frequency-selective semiconductor elements in accordance with the present invention make it possible to detect given spectral ranges or given wavelength ranges of the light produced by the flame, and to regulate the mixture of air and fuel on the basis of the existence and/or the intensity of those wavelength ranges. In that respect, it is possible to arrange a plurality of the photosensitive semiconductor arrangements which respectively select different wavelength ranges and which are connected together in such a way that, on the basis of the frequency distribution involved, combustion and/or intensity of the flame is regulated. This "matrix" of "frequency detectors" can be implemented by means of the present invention without additional filters or other components on a common chip. This gives a kind of "camera" on the basis of the principle of the CCD camera for visible light, in which respect not all elements of the matrix simultaneously send currents to the electronic evaluation arrangement, but only those which respond to the frequency that is just being emitted.

BRIEF DESCRIPTION OF THE DRAWINGS

Some preferred embodiments of the present invention will now be described in greater detail with reference to the accompanying drawings in which.

DESCRIPTION OF THE PREFERRED EMBODIMENTS

Figure 1:
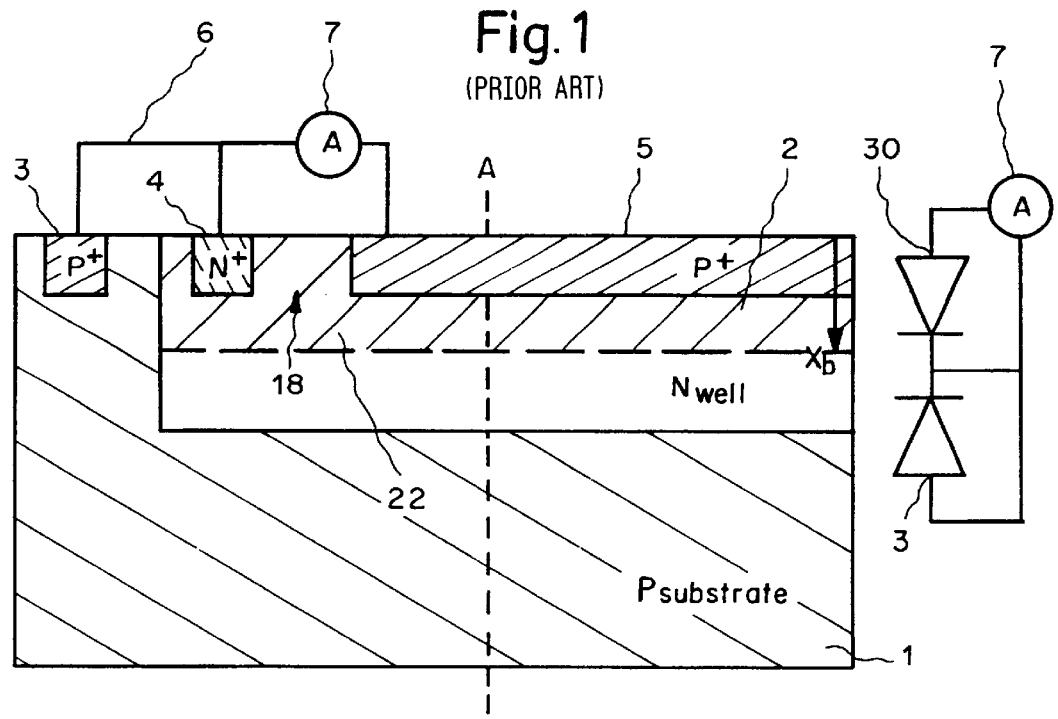
FIG. 1 shows a photosensitive semiconductor element of conventional kind.

FIG. 1 shows a photosensitive semiconductor element of conventional type, having a substrate 1, an intermediate layer 2 and an outer layer 5, wherein the intermediate layer is partially embedded within the substrate 1 and the outer layer 5 is partially embedded within the intermediate layer 2, and the intermediate layer 2 and the outer layer 5 form a photosensitive region 22 (shown hatched) to generate a light-dependent signal. The photosensitive region 22 is delimited downwardly by means of a potential barrier as far as a depth $X_b$. Between the outer layer 5 which is $P_+$-doped and an $N_+$-doped region 4 is an intermediate space 18 in which a potential is built up. The outer layer 5 and in part the N-doped intermediate layer ($N_{well}$) jointly form the photosensitive region 22.

The right-hand side of FIG. 1 shows the circuitry for the photosensitive semiconductor element, wherein the outer layer 5 represents the anode 30 and a P+-doped region 3 within the P-doped substrate 1 is short-circuited to the cathode 4 by way of a line 6. An ammeter 7 detects the current generated by the photosensitive region 22. The semiconductor element shown in FIG. 1 represents in particular a UV-selective photodiode which is intended to be designed for the detection of UV-light.

Figure 2:
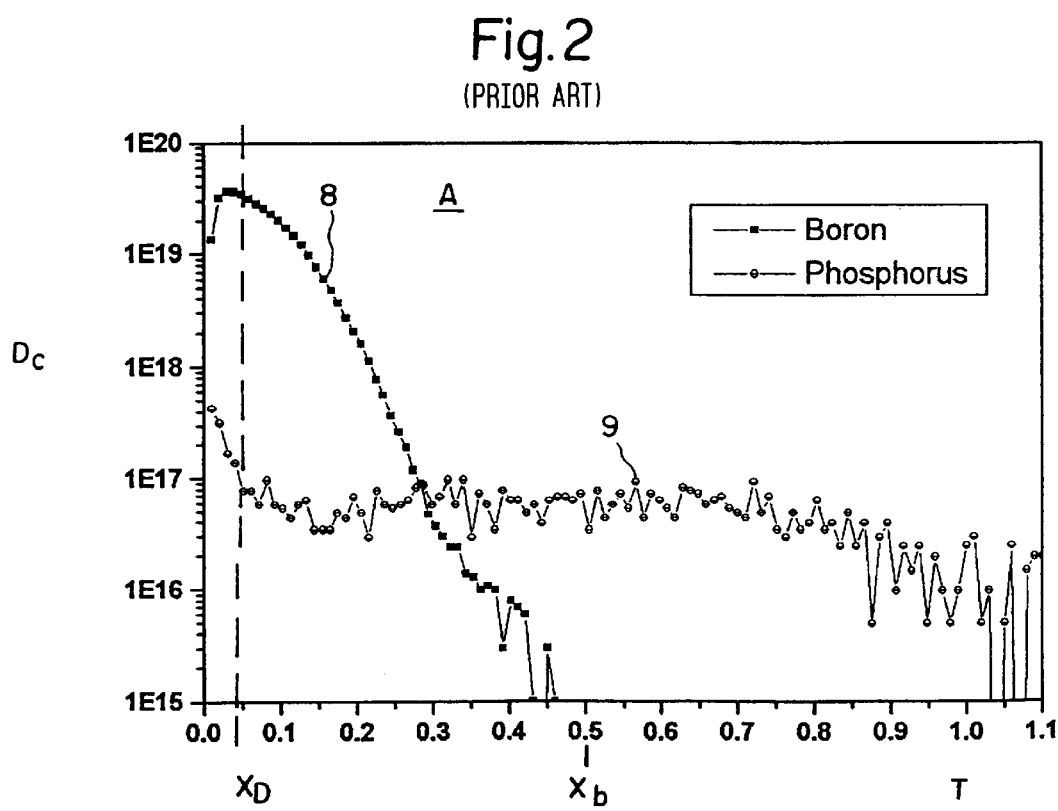
FIG. 2 is a diagram of the doping density of the semiconductor element taken along line A in FIG. 1.

FIG. 2 shows a diagram of the doping density of the semiconductor element along the line A in FIG. 1. The vertical axis of the diagram gives the concentration of the doping atoms $D_c$ in particles/cm³. The transverse axis gives the depth T in μm from the surface of the outer layer 5 in the direction of the subjacent substrate 1. The intermediate layer 2 is N-doped within the P-doped substrate 1 by means of phosphorus atoms (donors) while the outer layer 5 is $P_+$-doped within the intermediate layer 2 by means of boron atoms (acceptors). It can be seen by reference to the diagram that the concentration 8 of the boron atoms continuously decreases to a depth $X_b$ of about 500 nm while the concentration 9 of the phosphorus atoms is almost constant as far as a transition between the intermediate layer 2 and the substrate 1 (approximately double the depth $X_b$).

The doping profiles in FIG. 2 therefore correspond to a typical 0.5 μm standard C-MOS process. It can be seen that the doping density, that is to say the concentration 8 of boron atoms, is at the greatest at a depth $X_D$, that is to say it decreases again from that depth $X_D$ to the surface. That undesired effect which is due to doping effects and the redistribution of doping atoms is inevitable although it is precisely here that a particularly high degree of doping is wanted in order to achieve a high photocurrent. As a result, what is formed at the outer edge region of the outer layer 5 is a "dead layer" 12 on the silicon surface, precisely where most photons of the incident light (that is to say for example UV-light) are to be absorbed.

Figure 3:
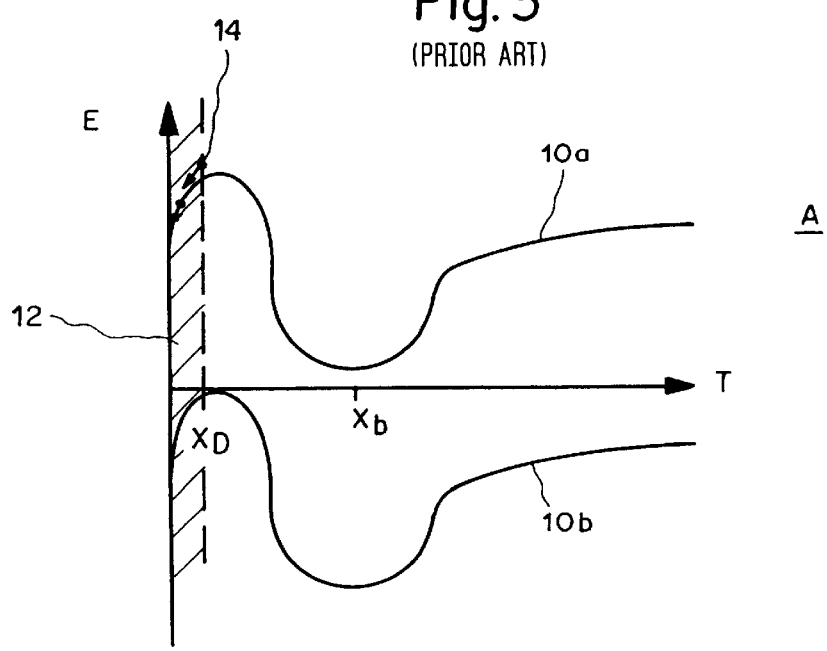
FIG. 3 is a diagrammatic view of the outer energy band of the semiconductor element taken along line A in FIG. 1.

FIG. 3 is a diagrammatic view of the outer energy band of the material of the semiconductor element along line A in FIG. 1 with the doping concentration shown in FIG. 2. Shown herein is the lower valence band 10b and the upper conduction band 10a and the energy levels thereof, measured from the surface in a direction towards the lower substrate 1. Also to be seen herein is the potential barrier at the depth $X_b$ which delimits the photosensitive region 22. It can also be seen however that the energy levels of both bands 10a and 10b fall at the surface 12 of the outer layer 5 to the depth $X_D$. That effect results from the above-described "dead layer" 12. The minority carriers 14 (electrons) generated by the photons, in the outer layer 5, that is to say also at the outer surface, recombine within the "dead layer" 12 due to the reduced boron concentration 8 by virtue of the above-described effects. As a result those electrons (and the holes corresponding thereto, that is to say the majority carriers) cannot contribute to the photocurrent and the result is a lower degree of sensitivity, that is to say a lower level of selectivity on the part of the semiconductor element for incident light.

Figure 4:
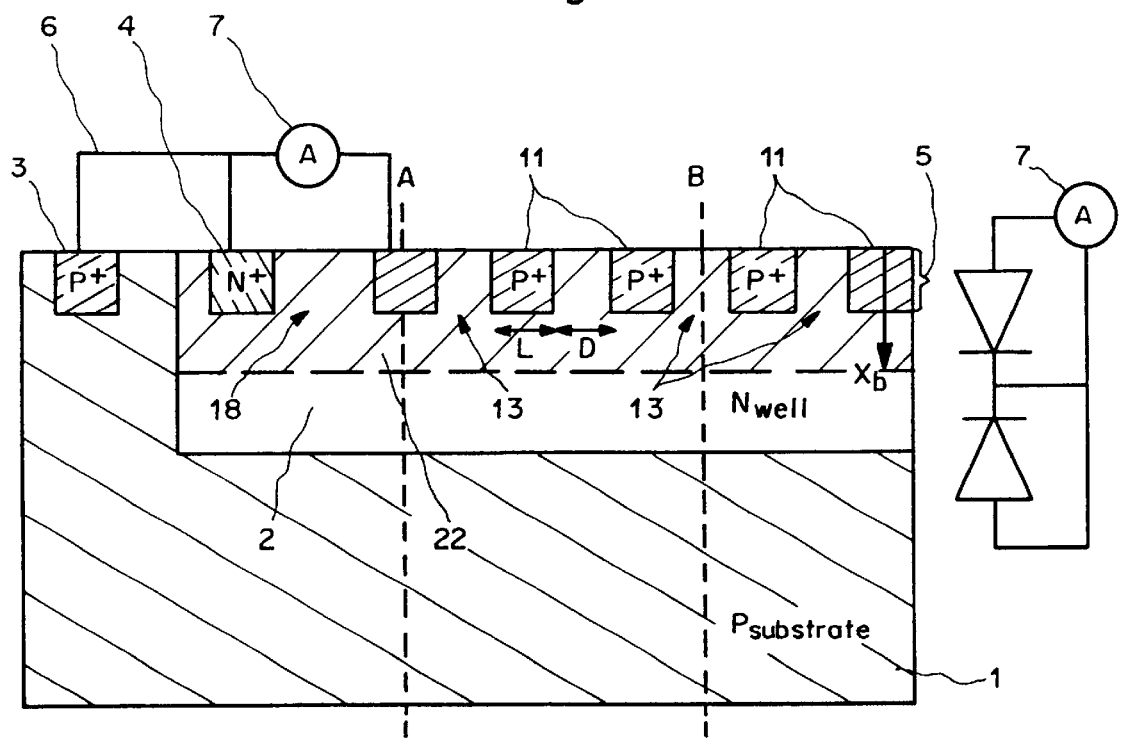
FIG. 4 shows a photosensitive semiconductor element according to the invention.

FIG. 4 shows a photosensitive semiconductor element according to the invention. The photosensitive semiconductor element according to the invention comprises a substrate 1, an intermediate layer 2 and an outer layer 5, wherein the intermediate layer 2 is at least partially embedded within the substrate 1 and the outer layer 5 is at least partially embedded within the intermediate layer 2 and the intermediate layer 2 and the outer layer 5 form a photosensitive region 22 for the generation of a light-dependent signal such as for example a photocurrent. The outer layer 5 which comprises P+-doped silicon is in that case divided into mutually spaced regions 11 which are separated by intermediate regions 13 of the intermediate layer 2. The intermediate layer 2 comprises N-doped silicon while the substrate 1 comprises P-doped silicon and carries both the intermediate layer 2 and also the outer layer 5 at the surface of the photosensitive semiconductor element.

Just as described with reference to FIG. 1, the spaced regions 11 of the outer layer 5 serve as an anode 30 of the photosensitive semiconductor element. The circuitry involved is also identical to FIG. 1.

The very high level of selectivity of the photosensitive semiconductor element according to the invention is achieved by the separation of the outer layer 5 into the mutually spaced regions 11. The mutually spaced regions 11 which are of a width L and which are arranged at a spacing D from each other prevent the formation of the inactive, that is to say "dead", layer at the surface of the outer layer 5.

Figure 5:
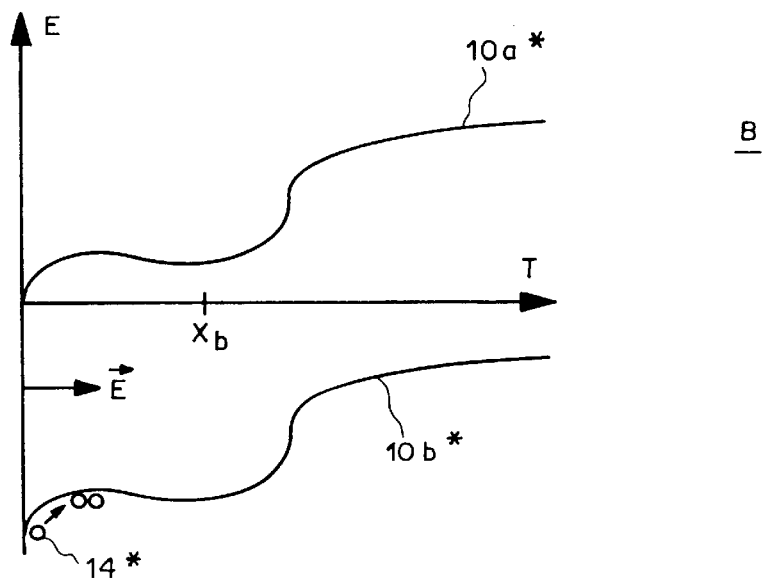
FIG. 5 is a diagrammatic view of the outer energy band of the semiconductor element taken along line B in FIG. 4.

That affords a modified profile in respect of the outer energy band, diagrammatically shown in FIG. 5, of the semiconductor element, along line B in FIG. 4. The energy band between the lower limit of the conduction band 10a* and the upper limit of the valence band 10b* of the correspondingly N-doped silicon atoms between the spaced regions 11 of the outer layer 5, that is to say within the intermediate regions 13, has, between the surface of the outer layer 5 and the depth $X_b$, a downwardly curved configuration as viewed from the depth $X_b$ in the direction of the surface, so that here—assisted by the potential produced thereby between the spaced regions 11—the minority carriers 14* (holes) existing in that region are pushed in the direction of the depth $X_b$, that is to say away from the surface towards the substrate 1. The "dead layer " 12 is minimised by the potential produced between the spaced regions 11. Thus, there can be no or only a slight degree of recombination of electrons and holes at the upper edge of the outer layer.

As can be seen from FIG. 2 there is an increase in the concentration 9 of the phosphorus atoms of the intermediate layer 2, that is to say within the intermediate layer regions 13 of the outer layer 5, towards the edge of the outer layer 5, which is due to segregation at the silicon/silicon dioxide junction. That increase causes at the energy band in FIG. 5 the slight energy drop in respect of the two bands 10a* and 10b* in the proximity of the surface of the outer layer 5 so that the holes 14* are pushed in the depth direction and the undesired recombination effect is prevented. The "dead zone " is reduced by a factor L/(L+D). In that respect the width L of the spaced-apart regions 11 can be designed to be as narrow as technically viable, but there is an optimum distance D between those regions 11, which is approximately twice as great as the depth $X_b$. A narrower distance D would result in an increase in the "dead layer " 12, while a greater distance D would urge the holes too far downwardly so that they diffuse into the substrate 1 and the level of light sensitivity would also be weakened thereby.

This therefore affords a high level of responsiveness in relation to incident light, which is wanted at the surface of the outer layer, as the electrons and holes produced by the correspondingly incident photons flow almost completely away to the anode and the cathode respectively without themselves already recombining beforehand. Accordingly the photocurrent is almost completely used for a given wavelength range for which the photodiode is designed.

Figure 6:
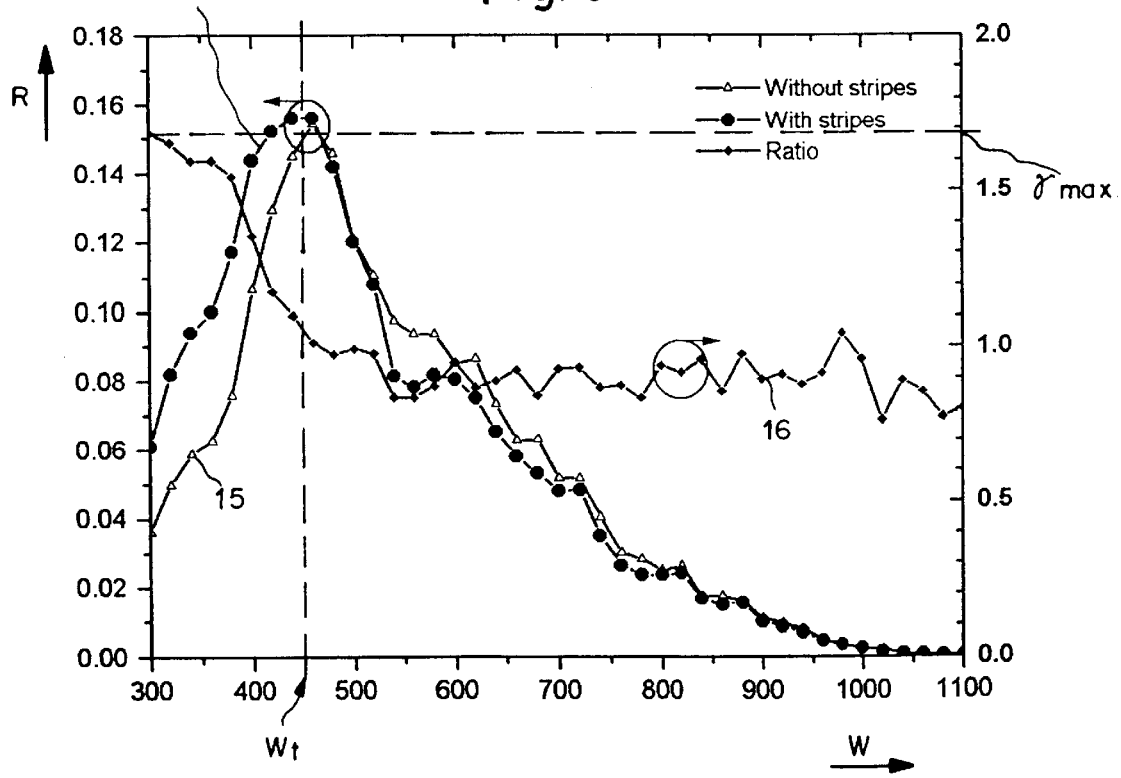
FIG. 6 is a diagram showing the responsiveness of the semiconductor element according to the invention in comparison with the conventional semiconductor elements.

FIG. 6 is a diagram illustrating the responsiveness of the semiconductor element according to the invention in comparison with the conventional semiconductor elements. Illustrated therein is the responsiveness or the signal R produced by the photosensitive region 22 for a semiconductor element in relation to the wavelength W (in nm) of the incident light without the use of the intermediate regions 13 according to the invention (illustrated by the curve 15), and for a semiconductor element with the use of the intermediate regions according to the invention (illustrated by the curve 17). Also shown is the ratio r of the two curves 15 and 17 to each other (illustrated by the curve 16). It will be seen that the signal R of the curve 17 for the semiconductor element according to the invention is stronger up to a predetermined wavelength Wt than the signal R of conventional semiconductor elements. At the wavelength of about 300 nm, the ratio r is at a maximum and is of a value of about $r_{max}=1.65$. In this respect the width L is of a value of about 0.6 μm and the distance is about 1.0 μm.

The semiconductor element according to the invention also has further advantages. The shunt resistance $R_{sh}$, which corresponds to the voltage-current ratio in the region around 0V is indirectly proportional to the size of the junction region or the barrier layer area and increases with increasing distance D. As that resistance is indirectly proportional to the error voltage of the photodiode, the latter is correspondingly smaller the greater the resistance is. This is greater in the case of the "stripe layer" 5 according to the invention, that is to say due to the spaced regions 11, whereby that error voltage is reduced. This is important in particular at high temperatures at which that error voltage can become critical. In addition, the provision of the spaced regions 11 reduces the capacitance of the photodiode which results in delayed response times by virtue of the interaction with the signal voltage. This is also to be attributed to the reduction in the size of the junction region or the barrier layer area.

Figure 7:
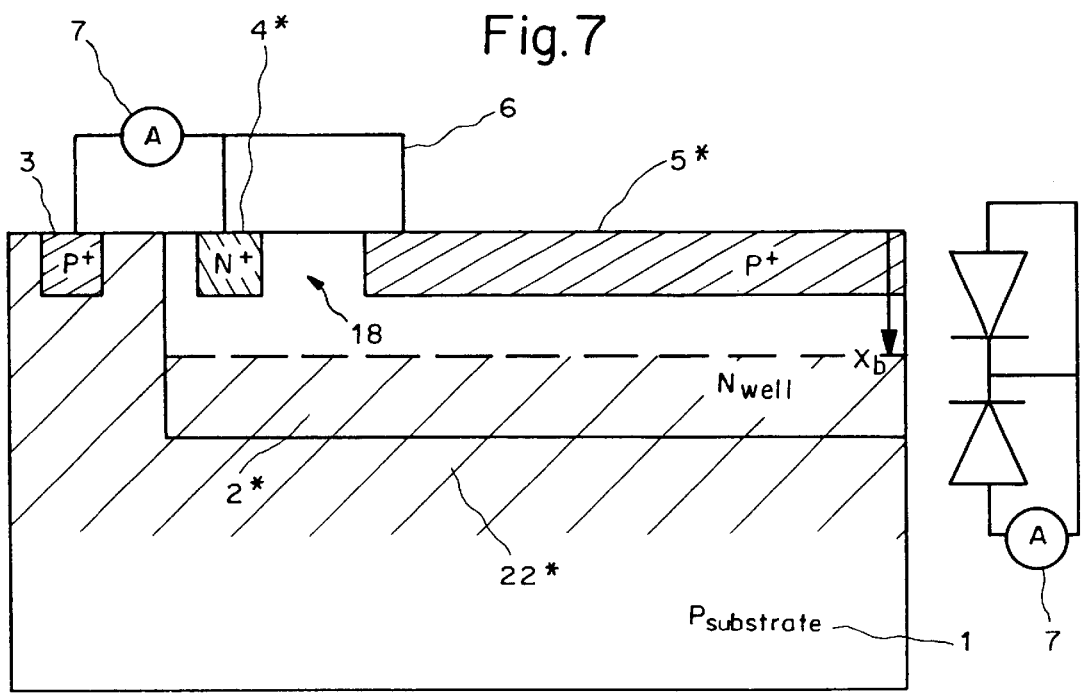
FIG. 7 shows a photosensitive semiconductor element for IR-light.

FIG. 7 shows a photosensitive semiconductor element with a different circuitry. The arrangement corresponds to that shown in FIG. 1, with the difference that it is not the $P^+$-doped region 3 that is short-circuited within the P-doped substrate 1, but the outer layer 2 which is short-circuited to the cathode 4* by way of a line 6. That results in the formation of the photosensitive region 22* as from a depth $X_b$ between the intermediate layer 2* and the substrate 1. An ammeter 7 detects the current generated by the photosensitive region 22*. The semiconductor element shown in FIG. 7 represents in particular an IR-selective photodiode which by virtue of the different circuitry detects those charge carriers which are generated by the greater wavelengths of the incident light in deeper layers from a depth of about 500 nm.

Figure 8:
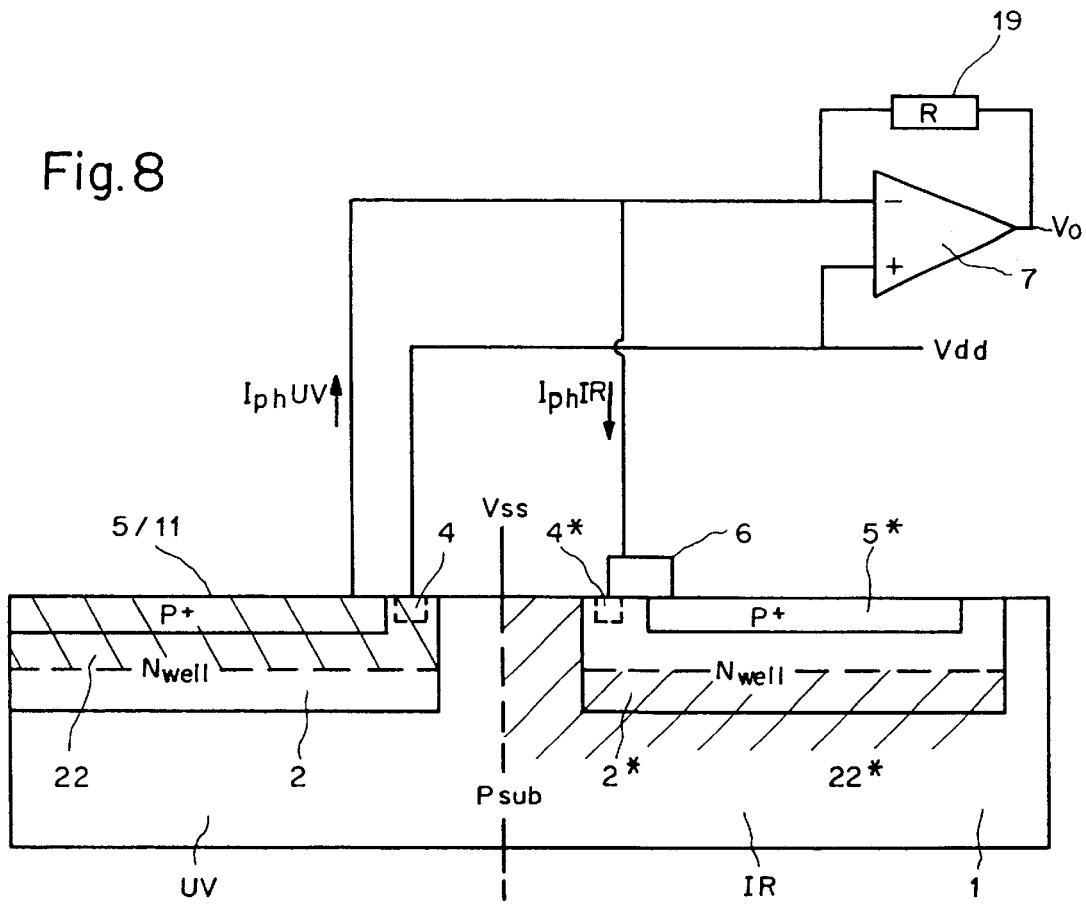
FIG. 8 shows a photosensitive semiconductor element arrangement according to the invention with the semiconductor elements illustrated in FIG. 4 and FIG. 7.
Figure 9:
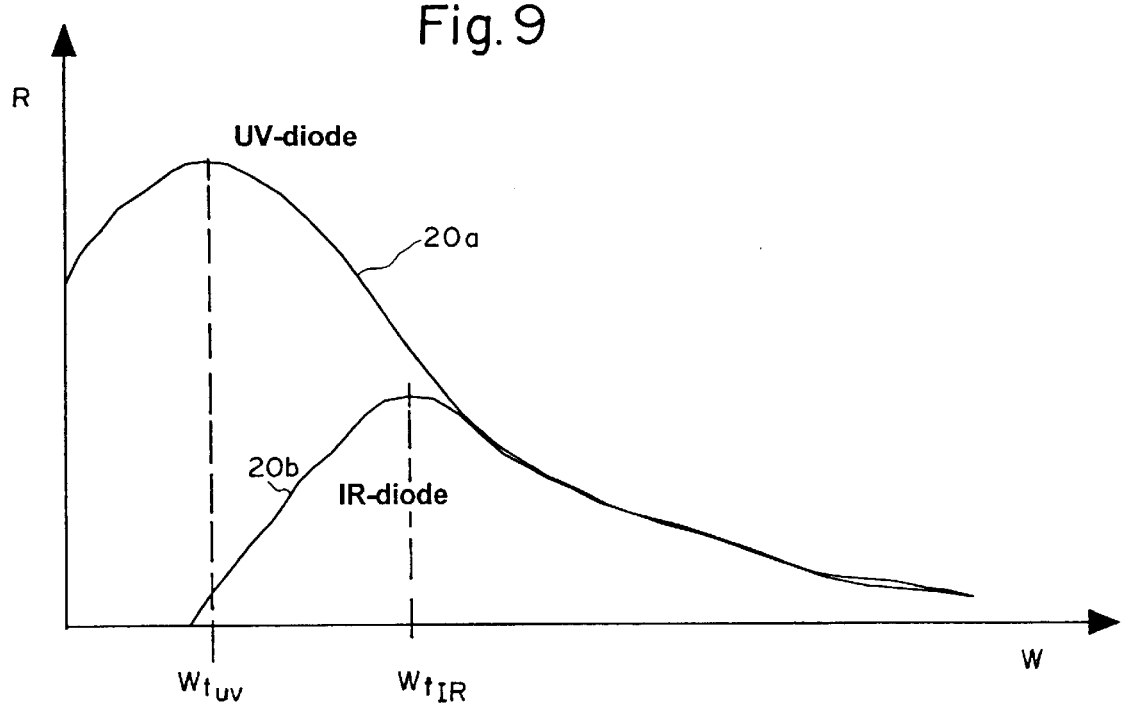
FIG. 9 is a diagram showing the photocurrents of the photosensitive semiconductor element arrangement of FIG. 8.

FIG. 8 shows a photosensitive semiconductor element arrangement according to the invention with the semiconductor elements shown in FIG. 4 and FIG. 7. The photosensitive semiconductor element arrangement comprises a substrate 1, two intermediate layers 2, 2* and two outer layers 5, 5*, wherein the intermediate layers 2, 2* are partially embedded within the substrate 1 and the outer layers 5, 5* are partially embedded within the corresponding intermediate layers 2, 2*, and the substrate 1, the intermediate layers 2, 2* and the outer layers 5, 5* form at least two photosensitive regions 22, 22* for generating light-dependent signals 20a, 20b (FIG. 9). The first outer layer 5 comprises the mutually spaced regions 11 and with the corresponding intermediate layer 2 forms a first photosensitive region 22 of a depth $X_b$. The second outer layer 5* with the corresponding intermediate layer 2* is short-circuited as shown in FIG. 7 so that there is formed a second photosensitive region 22* beneath the depth $X_b$, which comprises portions of the second intermediate layer 2* and the substrate 1.

The substrate is at the potential $V_{SS}$ and the intermediate layer 2 is at the potential $V_{dd}$. The first outer layer 5, the second outer layer 5* and the second intermediate layer 2* are at the virtual potential $V_{dd}$ produced by the output amplifier (OP-amp) 7. The input region of the output amplifier 7 must therefore permit biasing around the potential $V_{dd}$ in order to be able to measure just very small photocurrents. Instead of $V_{dd}$ however it is also possible to use a positive reference voltage for biasing of the output amplifier.

As shown in FIG. 9 the first photosensitive region 22 generates a first signal 20a and the second photosensitive region 22* generates a second signal 20b, wherein the second photosensitive region 22* is of such a size that, with an incident light from a predetermined wavelength $W_{tIR}$, the second signal 20b is of approximately the same magnitude as the first signal 20a.

Figure 10:
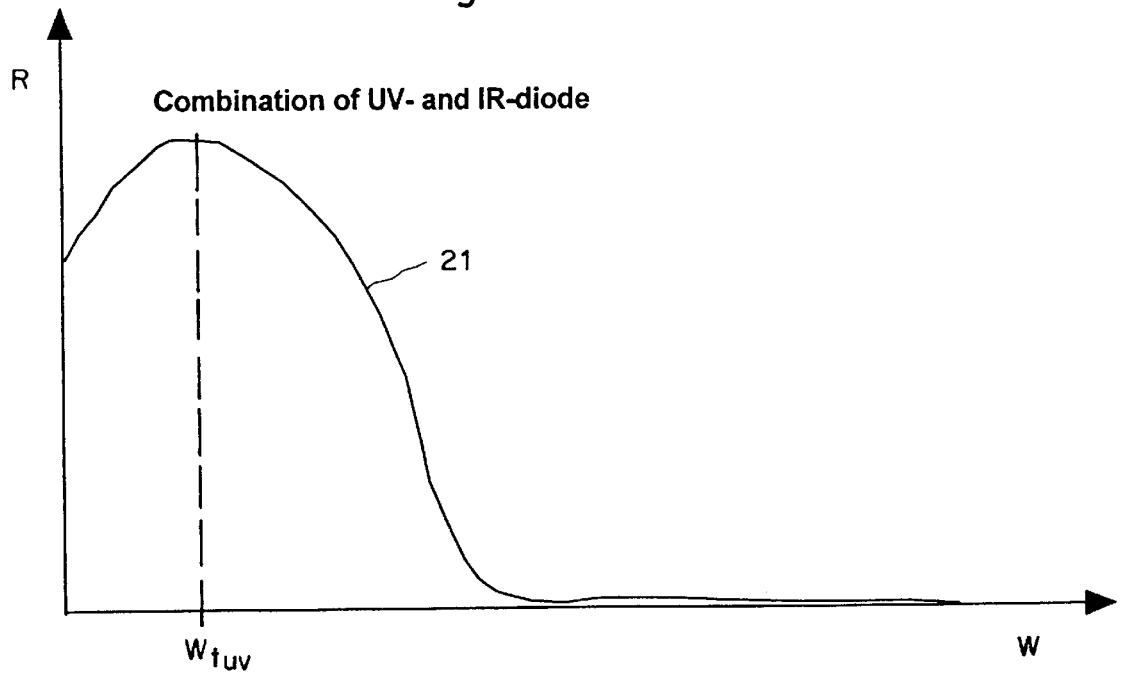
FIG. 10 shows the superimposed signals of FIG. 9.

In particular the first photosensitive region 22 is suitable for the detection of UV-light and the second photosensitive region 22* is suitable for the detection of IR-light, insofar as the first photosensitive region 22 generates a first photocurrent $I_{phUV}$ and the second photosensitive region 22* generates a second photocurrent $I_{phIR}$ and insofar as the second photosensitive region 22* is of such a size that, with an incident light from a wavelength of about 400–500 nm, the second photocurrent $I_{phIR}$ is approximately the same as the first photocurrent $I_{phUV}$. An operational amplifier 7 detects the combined signal 21 which is shown in FIG. 10 and which results from subtraction of the two signals 20a and 20b, wherein that signal is at the strongest at the wavelength $W_{tUV}$ and falls away sharply in the direction of the wavelength $W_{tIR}$ for which the second semiconductor element is designed. Accordingly therefore this gives improved selectivity, that is to say an "integrated" filter for sharp detection of individual wavelength ranges.

We claim:

1. A photosensitive semiconductor element comprising a substrate, an intermediate layer and an outer layer, wherein the intermediate layer is at least partially embedded within the substrate, the outer layer is at least partially embedded within the intermediate layer, the intermediate layer and the outer layer form a photosensitive region for the generation of a light-depent signal, and the outer layer is divided into mutually spaced regions which are separated by intermediate regions of the intermediate layer thereby to prevent formation of an inactive layer at the outer surface of the outer layer.

2. A semiconductor element as set forth in claim 1, wherein the substrate comprises P-doped silicon, the intermediate layer or the intermediate regions comprise N-doped silicon, the spaced regions comprise $P^+$-doped silicon and the spaced regions serve as the anode of the photosensitive semiconductor element.

3. A semiconductor element as set forth in claim 1, wherein the photosensitive region which includes the spaced regions, the intermediate regions and a portion of the intermediate layer, for the detection of given incident light wavelength ranges, is of a depth of the order of magnitude of about a wavelength of the incident light.

4. A semiconductor element as set forth in claim 1, wherein the photosensitive region, for the detection of ultraviolet light, is of a depth of the order of magnitude of between 0.01 and 0.5 μm, preferably between 0.1 and 0.4 μm.

5. A semiconductor element as set forth in claim 1, wherein the intermediate regions are of a width which is approximately twice the depth of the photosensitive region.

6. A semiconductor element as set forth in claim 1, wherein a portion of the intermediate layer which is possibly N$^+$doped serves as the cathode of the photosensitive semiconductor element and the cathode, the anode and possibly the substrate are connected to an electronic evaluation arrangement which is also disposed on the substrate.

7. A photosensitive semiconductor element arrangement comprising at least one substrate, at least two intermediate layes and at least fit and second outer layers, wherein the intermediate layers are at least partially embedded within the at least one substrate, the outer layers are at least partially embedded within the corrending intermediate layers, the at least one substrate, the intennediate layers and the outer layers form at least first and second photosensitive regions suitable for the generation of light-dependent signals, the first outer layer comprises mutually spaced regions which are separated by intennediate regions of the corresponding intermediate layer, the first outer layer with the corresponding intermediate layer forms the first photosensitive region of depth $X_b$, and the second outer layer is short-circuited to the corresponding intermediate layer so that there is formed the second photosensitive region beneath the depth $X_b$, which comprises portions of the second intermediate layer and the at least one substrate.

8. A semiconductor element arrangement as set forth in claim 7, wherein the first photosensitive region serves for the detection of a predetermined incident light wavelength range and the second photosensitive region serves for the detection of another incident light wavelength range.

9. A semiconductor element arrangement as set forth in claim 7, wherein the first photosensitive region serves for the detection of a predetermined incident light wavelength range, the second photosensitive region serves for the detection of an adjacent wavelength range, and the corresponding layers are connectable to an electronic evaluation arrangement in such a way that the adjacent wavelength range component detected by the first photosensitive region can be substantially suppressed.

10. A semiconductor element arrangement as set forth in claim 7, wherein the first photosensitive region generates a first signal, the second photosensitive region generates a second signal, and the second photosensitive region is of such a size that with incident light of a predetermined wavelength the second signal is approximately of the same magnitude as the first signal.

11. A semiconductor element arrangement as set forth in claim 7, wherein the first photosensitive region serves primarily for the detection of UV-light, the second photosensitive region serves primarily for the detection of IR-light, the first photosensitive region generates a first photocurrent, the second photosensitive region generates a second photocurrent, and the second photosensitive region is of such a size that the second photocurrent at an incident light from a wavelength of about 400–500 nm is of approximately the same magnitude as the first photocurrent.

12. A photosensitive circuit having a semiconductor element comprising a substrate, an intermediate layer and an outer layer, wherein the intermediate layer is at least partially embed within the substrate, the outer layer is at least partially embedded within the intermediate layer, the intermediate layer and the outer layer form a photosensitive region for the generation of a light-dependent signal, and the outer layer is divided into mutually spaced regions which are separated by intermediate regions of the intermediate layer thereby to prevent formation of an inactive layer at the outer surface of the outer layer, and wherein all layers of the semiconductor element are jointly produced by using CMOS technology on one substrate.

13. A photosensitive circuit having a photosensitive semiconductor element arrangement comprising at least one substrate, at least two intermediate layers and at least first and second outer layers, wherein the intermediate layers are at least partially embedded within the at least one substrate, the outer layers are at least partially embedded within the corresponding intermediate layers, the at least one substrate, the intermediate layers and the outer layers form at least first and second photosensitive regions suitable for the generation of light-dependent signals, the first outer layer comprises mutually spaced regions which are separated by intermediate regions of the corresponding intermediate layer, the first outer layer with the corresponding intermediate layer forms the first photosensitive region of a depth $X_b$, and the second outer layer is short-circuited to the corresponding intermediate layer so that there is formed the second photosensitive region beneath the depth $X_b$, which comprises portions of the second intermediate layer and the at least one substrate, and wherein all layers of the photosensitive semiconductor element arrangement are jointly produced using CMOS technology on one substrate.

* * * * *